(12) United States Patent
Ishino et al.

(10) Patent No.: US 12,261,050 B2
(45) Date of Patent: Mar. 25, 2025

(54) METHOD OF MANUFACTURING SEMICONDUCTOR DEVICE, AND ETCHING GAS

(71) Applicants: KIOXIA CORPORATION, Tokyo (JP); KANTO DENKA KOGYO CO., LTD., Tokyo (JP)

(72) Inventors: Takaya Ishino, Yokkaichi (JP); Toshiyuki Sasaki, Yokkaichi (JP); Mitsuharu Shimoda, Shibukawa (JP); Hisashi Shimizu, Shibukawa (JP)

(73) Assignees: KIOXIA CORPORATION, Tokyo (JP); KANTO DENKA KOGYO CO., LTD., Tokyo (JP)

(*) Notice: Subject to any disclaimer, the term of this patent is extended or adjusted under 35 U.S.C. 154(b) by 0 days.

(21) Appl. No.: 18/325,640

(22) Filed: May 30, 2023

(65) Prior Publication Data

US 2023/0307244 A1 Sep. 28, 2023

Related U.S. Application Data

(60) Division of application No. 17/197,544, filed on Mar. 10, 2021, now abandoned, which is a continuation of
(Continued)

(30) Foreign Application Priority Data

Sep. 11, 2018 (JP) ................. 2018-169983

(51) Int. Cl.
*H01L 21/306* (2006.01)
*H01L 21/3065* (2006.01)
*H01L 21/3213* (2006.01)

(52) U.S. Cl.
CPC ...... *H01L 21/3065* (2013.01); *H01L 21/3213* (2013.01)

(58) Field of Classification Search
CPC ............ H01L 21/3065; H01L 21/3213; H01L 21/31116; H01L 27/11582; C09K 13/08
(Continued)

(56) References Cited

U.S. PATENT DOCUMENTS 8,735,246 B2   5/2014 Kuboi et al.
9,514,959 B2   12/2016 Anderson et al.
(Continued)

FOREIGN PATENT DOCUMENTS

CN   1693948 A    11/2005
CN   103718277 A  4/2014
(Continued)

OTHER PUBLICATIONS

International Search Report issued in PCT/JP2019/027316 filed on Jul. 10, 2019, 2 pages.
(Continued)

*Primary Examiner* — Duy Vu N Deo
(74) *Attorney, Agent, or Firm* — Oblon, McClelland, Maier & Neustadt, L.L.P.

(57) ABSTRACT

In one embodiment, a method of manufacturing a semiconductor device includes etching a film with etching gas that includes a chain hydrocarbon compound expressed as $C_xH_yF_z$ where C, H and F respectively denote carbon, hydrogen and fluorine, "x" denotes an integer of three or more, and "y" and "z" respectively denote integers of one or more. Furthermore, the $C_xH_yF_z$ is the chain hydrocarbon compound in which each of terminal carbon atoms on a carbon chain of the chain hydrocarbon compound is bonded only to fluorine atoms out of hydrogen and fluorine atoms.

12 Claims, 6 Drawing Sheets

Related U.S. Application Data application No. PCT/JP2019/027316, filed on Jul. 10, 2019.

(58) Field of Classification Search
USPC .......................................................... 438/706
See application file for complete search history.

(56) References Cited

U.S. PATENT DOCUMENTS

| | | | |
|---|---|---|---|
| 9,728,422 | B2 | 8/2017 | Oomori et al. |
| 10,741,406 | B2 | 8/2020 | Oomori et al. |
| 2005/0266691 | A1 | 12/2005 | Gu et al. |
| 2014/0302683 | A1 | 10/2014 | Kikuchi et al. |
| 2015/0294880 | A1 | 10/2015 | Anderson et al. |
| 2015/0357200 | A1 | 12/2015 | Inui |
| 2016/0218015 | A1 | 7/2016 | Oomori et al. |
| 2017/0365487 | A1 | 12/2017 | Shen et al. |
| 2018/0277387 | A1 | 9/2018 | Royer |
| 2018/0337090 | A1* | 11/2018 | Shen ................. H01L 21/76813 |
| 2018/0374863 | A1* | 12/2018 | Purayath ............ H01L 29/4966 |
| 2019/0259668 | A1* | 8/2019 | Park ................ H01L 21/823468 |

FOREIGN PATENT DOCUMENTS

| | | |
|---|---|---|
| CN | 104871298 A | 8/2015 |
| EP | 2 733 725 A1 | 5/2014 |
| JP | 2006-156539 A | 6/2006 |
| JP | 2007-537602 A | 12/2007 |
| JP | 2008300616 A * | 12/2008 |
| JP | 2008800616 A | 12/2008 |
| JP | WO2012/023537 A1 | 2/2012 |
| JP | 2013-030531 A | 2/2013 |
| JP | 2013-175605 A | 9/2013 |
| JP | 5569353 B2 | 8/2014 |
| JP | 5569416 B2 | 8/2014 |
| JP | 2016-139782 A | 8/2016 |
| JP | 2016-149451 A | 8/2016 |
| JP | 2017-163032 A | 9/2017 |
| JP | 2018-50074 A | 3/2018 |
| KR | 10-2014-0051332 | 4/2014 |
| KR | 10-2015-0099515 | 8/2015 |
| TW | I279861 B | 4/2007 |
| TW | 201209913 A1 | 3/2012 |
| TW | 201313878 A1 | 4/2013 |
| TW | 201639033 A | 11/2016 |
| WO | WO 2013/015033 A1 | 1/2013 |
| WO | WO 2014/104290 A1 | 7/2014 |
| WO | WO 2017/026197 A1 | 2/2017 |

OTHER PUBLICATIONS

PubChem, 1,1,1,2,2,3,4,5,5,5-Decafluoropentane (Year 2005).
PubChem, 1,1,1,4,4,4-Hexafluorobutane (Year 2005).
PubChem, 1,1,3,3,4,4,4-Heptafluoro-1-butene (Year 2007).
PubChem, (E)-1,1,1,3,4,4,4-Heptafluoro-2-butene (Year 2005).
PubChem, 1,1,3,3,3-Pentafluoropropene (Year 2005).

* cited by examiner

| C=4 |||||
| --- | --- | --- | --- | --- |
| D.B.=2 || D.B.=1 | D.B.=0 | Cyclic Structure |
| C₄HF₅ | C₄H₂F₄ | C₄H₂F₆ | C₄H₄F₆ | C₄F₈ |
| (structure) | (structure) | (structure) | (structure) | (structure) REFERENCE |

METHOD OF MANUFACTURING SEMICONDUCTOR DEVICE, AND ETCHING GAS

CROSS REFERENCE TO RELATED APPLICATION

This application is a divisional of and claims benefit under 35 U.S.C. § 120 to U.S. application Ser. No. 17/197,544 filed Mar. 10, 2021, which is a continuation of and claims benefit under 35 U.S.C. § 120 to International Patent Application No. PCT/JP2019/027316 filed Jul. 10, 2019, which is based upon and claims the benefit of priority under 35 U.S.C. § 119 from Japanese Patent Application No. 2018-169983, filed Sep. 11, 2018, the entire contents of each of which are incorporated herein by reference.

FIELD

Embodiments described herein relate to a method of manufacturing a semiconductor device, and etching gas.

BACKGROUND

When a semiconductor device such as a three-dimensional memory is manufactured, a concave portion is often formed in a process target film by etching with fluorohydrocarbon ($C_xH_yF_z$) gas.

DETAILED DESCRIPTION

Embodiments will now be explained with reference to the accompanying drawings. In FIGS. 1A to 6, the same or similar components are given the same signs and their duplicated description is omitted.

In one embodiment, a method of manufacturing a semiconductor device includes etching a film with etching gas that includes a chain hydrocarbon compound expressed as $C_xH_yF_z$ where C, H and F respectively denote carbon, hydrogen and fluorine, "x" denotes an integer of three or more, and "y" and "z" respectively denote integers of one or more. Furthermore, the $C_xH_yF_z$ is the chain hydrocarbon compound in which each of terminal carbon atoms on a carbon chain of the chain hydrocarbon compound is bonded only to fluorine atoms out of hydrogen and fluorine atoms.

First Embodiment

Figure 1A:
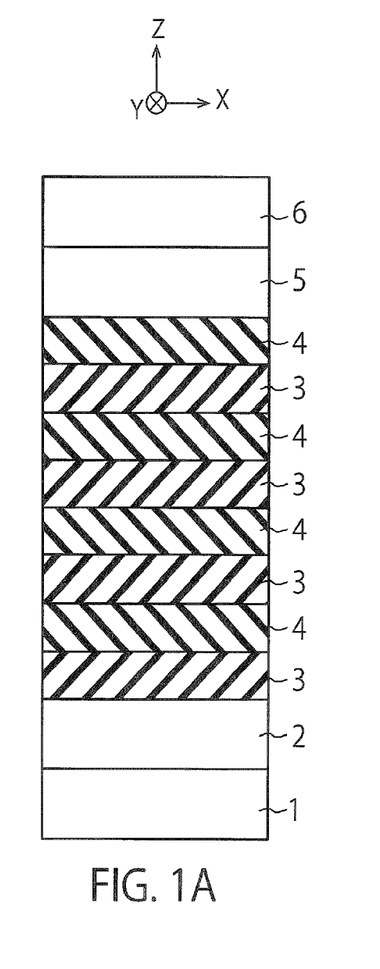
FIGS. 1A to 1C are sectional views showing a method of manufacturing a semiconductor device of a first embodiment.
Figure 1B:
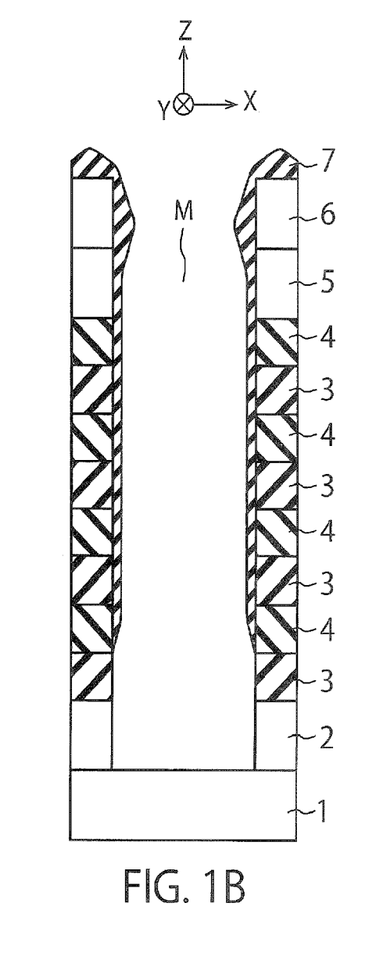
Figure 1C:
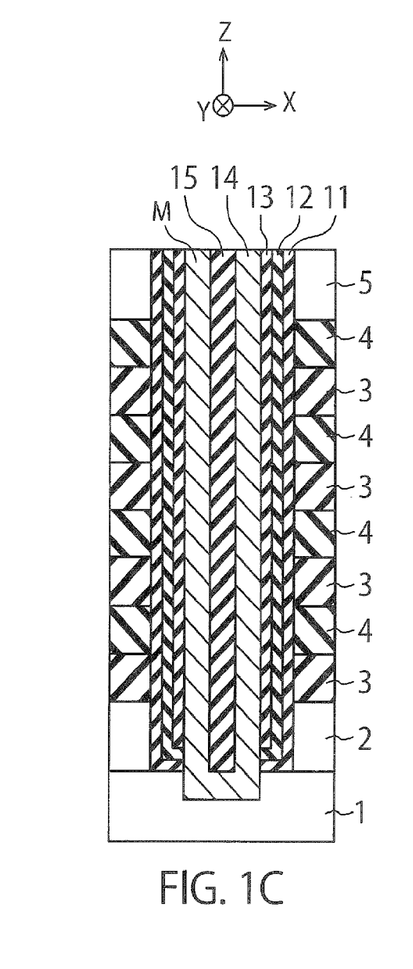

FIGS. 1A to 1C are sectional views showing a method of manufacturing a semiconductor device of a first embodiment. The semiconductor device of the present embodiment will be described by describing its example "three-dimensional memory."

First, a lower layer 2 is formed on a substrate 1, and a stacked film is formed which alternately includes a plurality of sacrificial layers 3 and a plurality of insulating layers 4, on the lower layer 2 (FIG. 1A). The sacrificial layers 3 are examples of first films, and the insulating layers 4 are examples of second films. Next, an upper layer 5 is formed on this stacked film, and a mask layer 6 is formed on the upper layer 5 (FIG. 1A).

The substrate 1 is, for example, a semiconductor substrate such as a silicon (Si) substrate. FIG. 1A shows an X-direction and a Y-direction which are parallel to a surface of the substrate 1 and perpendicular to each other, and a Z-direction perpendicular to the surface of the substrate 1. In the present specification, the +Z-direction is regarded as the upward direction, and the −Z-direction is regarded as the downward direction. The −Z-direction may coincide with the direction of gravity or may not coincide with the direction of gravity.

The lower layer 2 is, for example, an insulator such as a silicon oxide film ($SiO_2$) or a silicon nitride film (SiN), or a conducting layer formed between insulators. The sacrificial layers 3 are, for example, silicon nitride films, and the insulating layers 4 are, for example, silicon oxide films. The upper layer 5 is, for example, an insulator such as a silicon oxide film or a silicon nitride film, or a conducting layer formed between insulators. The mask layer 6 is, for example, an organic hard mask layer.

Next, an opening pattern for forming a memory hole M is formed in the mask layer 6 by lithography and dry etching (FIG. 1B). Next, the memory hole M penetrating the upper layer 5, the plurality of insulating layers 4, the plurality of sacrificial layers 3 and the lower layer 2 is formed by dry etching using the mask layer 6 (FIG. 1B). An aspect ratio of the memory hole M is, for example, 10 or more. The memory hole M is an example of a concave portion.

The memory hole M of the present embodiment is formed by dry etching using etching gas including $C_xH_yF_z$ (fluorohydrocarbon) gas. Note that C, H and F respectively denote carbon, hydrogen and fluorine, and "x", "y" and "z" respectively denote integers of one or more. Consequently, a protecting film 7 is formed on side faces (lateral faces) of the insulating layers 4 and the sacrificial layers 3 in the memory hole M during the dry etching, and the side faces of the insulating layers 4 and the sacrificial layers 3 are protected by the protecting film 7. The protecting film 7 of the present embodiment is a $C_mF_n$ (fluorocarbon) film. Note that "m" and "n" respectively denote integers of one or more. The $C_xH_yF_z$ of the present embodiment is, for example, a chain hydrocarbon compound in which "x" is an integer of three or more and "y" and "z" are respectively integers of one or more.

In the present embodiment, each of terminal carbon (C) atoms on a carbon chain of $C_xH_yF_z$ gas is bonded only to fluorine atoms out of hydrogen atoms (H atoms) and fluorine atoms (F atoms). In other words, none of H atoms are bonded to the terminal C atoms on the carbon chain. For example, when the $C_xH_yF_z$ molecule is a linear chain-type chain $C_4H_4F_6$ molecule, the $C_4H_4F_6$ molecule includes two terminal C atoms and two non-terminal C atoms. The two terminal C atoms are bonded only to F atoms out of H atoms and F atoms and are not bonded to H atoms. All the four H atoms are bonded to the non-terminal C atoms. The $C_xH_yF_z$ molecule of the present embodiment may be other than a linear chain-type chain $C_xH_yF_z$ molecule as long as it includes terminal C atoms, and may be, for example, a side chain-type chain $C_xH_yF_z$ molecule. The side chain-type chain $C_xH_yF_z$ molecule includes three or more terminal C atoms.

The present embodiment makes it possible to form the memory hole M while preferably protecting the side faces of the insulating layers 4 and the sacrificial layers 3 in the memory hole M with the protecting film 7, by performing dry etching using the etching gas as above. Details of such an effect of the present embodiment are mentioned later.

Next, the protecting film 7 and the mask layer 6 are removed, and a block insulator 11, a charge storage capacitor 12 and a tunnel insulator 13 are sequentially formed in the memory hole M (FIG. 1C). Next, the block insulator 11, the charge storage capacitor 12 and the tunnel insulator 13 are removed from a bottom part of the memory hole M, and a channel semiconductor layer 14 and a core insulator 15 are sequentially formed in the memory hole M (FIG. 1C). The charge storage capacitor 12 is, for example, a silicon nitride film. The channel semiconductor layer 14 is, for example, a polysilicon layer. The block insulator 11, the tunnel insulator 13 and the core insulator 15 are, for example, silicon oxide films or metal insulators.

After that, the sacrificial layers 3 are removed via a slit or a hole formed at a different position from that of the memory hole M to form a plurality of hollows between the insulating layers 4, and a plurality of electrode layers are formed in these hollows. Moreover, various plugs, lines and inter layer dielectrics and the like are formed on the substrate 1. As above, the semiconductor device of the present embodiment is manufactured.

Figure 2A:
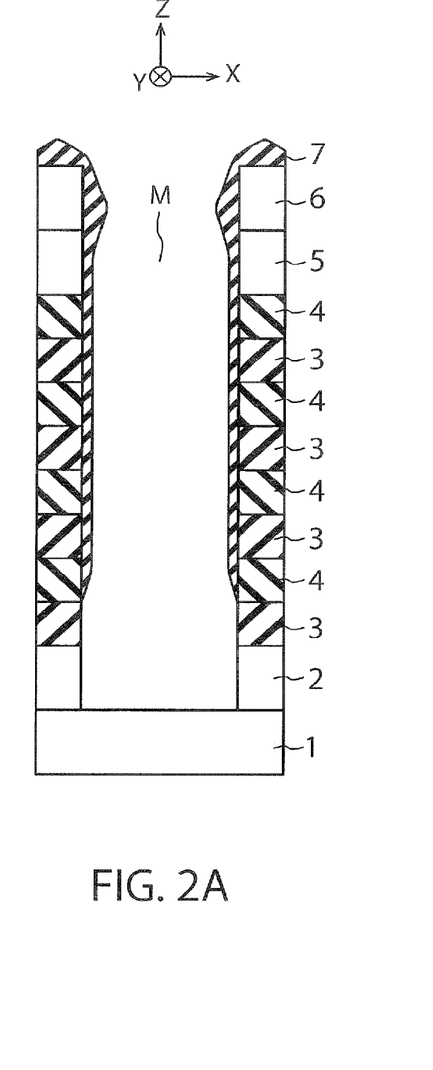
FIGS. 2A and 2B are sectional views for explaining advantages of the method of manufacturing the semiconductor device of the first embodiment.
Figure 2B:
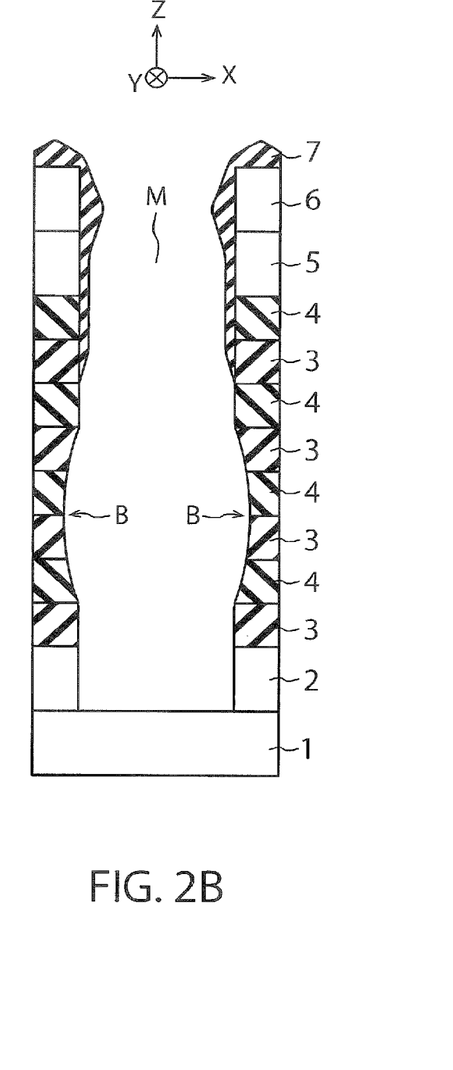

FIGS. 2A and 2B are sectional views for explaining advantages of the method of manufacturing the semiconductor device of the first embodiment.

FIG. 2A shows the protecting film 7 that is formed down to a deep place in the memory hole M. In this case, since the side faces of the insulating layers 4 and the sacrificial layers 3 are sufficiently protected by the protecting film 7, the side faces of the insulating layers 4 and the sacrificial layers 3 are scarcely shaved during etching.

On the other hand, FIG. 2B shows the protecting film 7 that is formed only at a shallow place in the memory hole M. In this case, since the side faces of the insulating layers 4 and the sacrificial layers 3 are not sufficiently protected by the protecting film 7, the side faces of the insulating layers 4 and the sacrificial layers 3 are shaved during etching by a larger value than a predetermined one. This results in a depression called bowing in these side faces (refer to sign B). This problem is more remarkable with a higher aspect ratio of the memory hole M.

The insulating layers 4 and the sacrificial layers 3 of the present embodiment are etched using plasma generated from the $C_xH_yF_z$ gas in the step of FIG. 1B. Specifically, the protecting film 7 is formed with radicals included in the plasma, and the side faces of the insulating layers 4 and the sacrificial layers 3 are etched with ions included in the plasma. It is therefore considered that the protecting film 7 as shown in FIG. 2A is formed when radicals can reach a deep place in the memory hole M. On the other hand, it is considered that the protecting film 7 as shown in FIG. 2B is formed when radicals cannot reach a deep place in the memory hole M.

Figure 3:
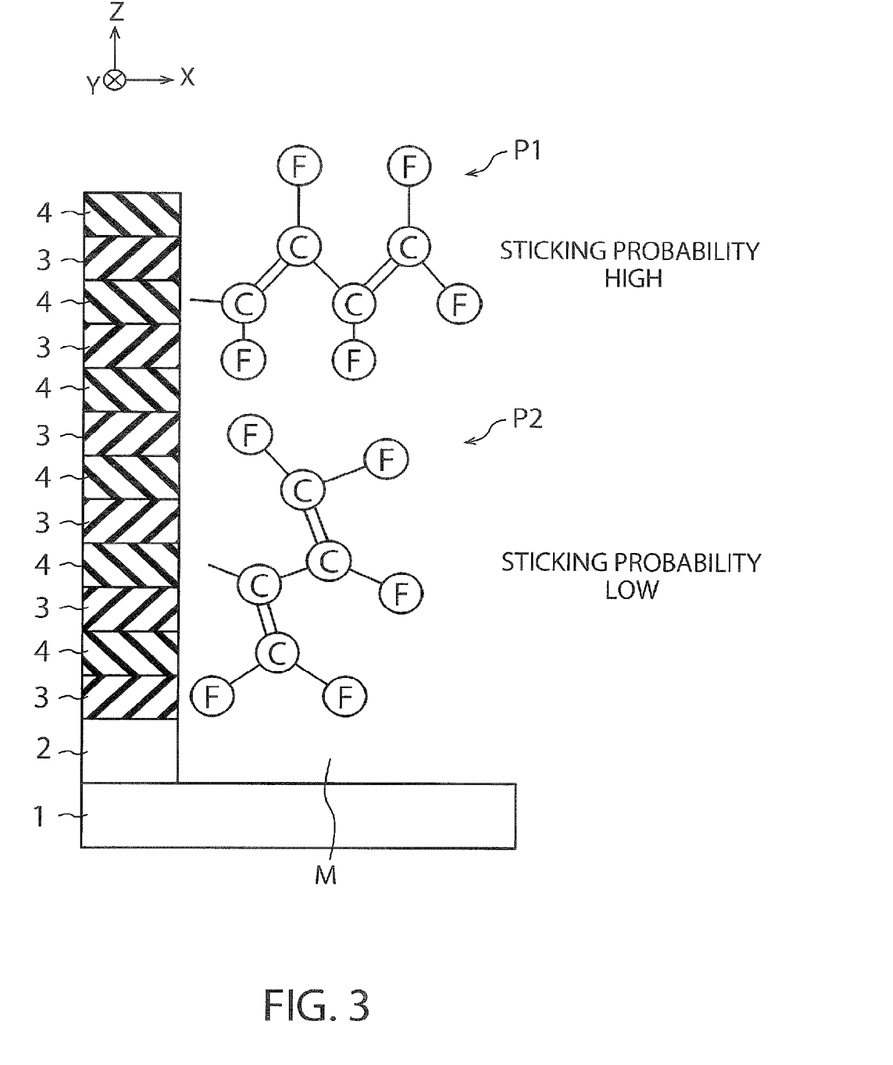
FIG. 3 is a schematic sectional view for explaining advantages of the method of manufacturing the semiconductor device of the first embodiment.

FIG. 3 is a schematic sectional view for explaining advantages of the method of manufacturing the semiconductor device of the first embodiment.

Sign P1 denotes a radical generated by eliminating an H atom from a $C_4HF_5$ molecule in which a terminal C atom is bonded to the H atom. Etching gas including this $C_4HF_5$ molecule ($CF_2$=CF—CF=CHF) is, for example, etching gas of a comparative example of the present embodiment.

On the other hand, sign P2 denotes a radical generated by eliminating an H atom from a $C_4HF_5$ molecule in which a non-terminal C atom is bonded to the H atom (namely, the terminal C atoms are not bonded to the H atom). Etching gas including this $C_4HF_5$ molecule ($CF_2$=CF—CH=$CF_2$) is an example of etching gas of the present embodiment.

In a $C_xH_yF_z$ molecule, the bond energy of a C—H bond is smaller than the bond energy of a C—F bond, and the C—H bond is more easily cleaved than the C—F bond. Therefore, when the $C_xH_yF_z$ molecule is made into plasma, a C—H bond is often cleaved to leave an unpaired electron at the place of the C—H bond. Sign P1 denotes the radical that has an unpaired electron at the terminal C atom, and sign P2 denotes the radical that has an unpaired electron at the non-terminal C atom.

Unpaired electrons have high reactivity and this causes radicals to stick onto the side faces of the insulating layers 4 and the sacrificial layers 3. In this case, when a radical has an unpaired electron at a non-terminal C atom as denoted by sign P2, the radical scarcely sticks onto the side faces of the insulating layers 4 and the sacrificial layers 3 because of large steric hindrance around the unpaired electron. In other words, F atoms around the unpaired electron disturb the reaction of the unpaired electron with the side faces of the insulating layers 4 and the sacrificial layers 3. On the other hand, when a radical has an unpaired electron at a terminal C atom as denoted by sign P1, the radical easily sticks onto the side faces of the insulating layers 4 and the sacrificial layers 3 because of small steric hindrance around the unpaired electron.

It is consequently considered that the radical with sign P1 scarcely reach the deep place in the memory hole M since it has a high sticking possibility onto the side faces of the insulating layers 4 and the sacrificial layers 3. On the other hand, it is considered that the radical with sign P2 easily reaches the deep place in the memory hole M since it has a low sticking possibility onto the side faces of the insulating layers 4 and the sacrificial layers 3. The present embodiment therefore makes it possible to form the protecting film 7 down to a deep place in the memory hole M by using radicals as denoted by sign P2 (see FIG. 2A).

Figure 4A:
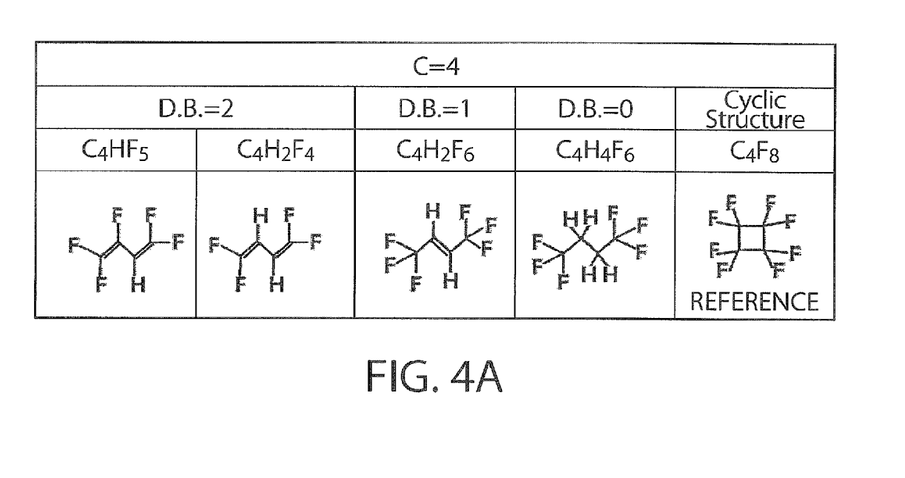
FIGS. 4A to 4C are tables showing examples of etching gas of the first embodiment.
Figure 4B:
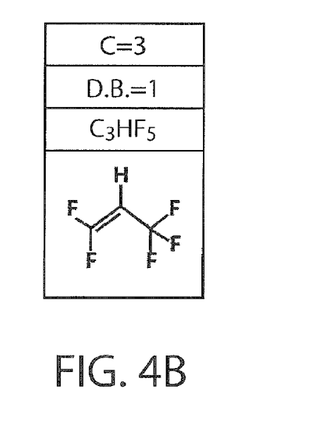
Figure 4C:
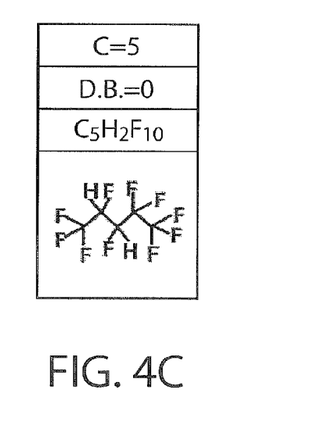

FIGS. 4A to 4C are tables showing examples of the etching gas of the first embodiment.

FIGS. 4A to 4C show various kinds of $C_xH_yF_z$ gas where the value of "x" is an integer from 3 to 5 and y≤z. The reason why the value of "x" is 3 to 5 is that $C_xH_yF_z$ with the value of "x" being 6 or more has low vapor pressure and is hard to feed as gas at the normal temperature. FIG. 4A shows examples with four C atoms (x=4), FIG. 4B shows an example with three C atoms (x=3), and FIG. 4C shows an example with five C atoms (x=5). Each value of "D.B." in the tables represents the number of double bond(s) in a CHF molecule. FIG. 4A also shows cyclic $C_4F_8$ for reference.

Figure 5:
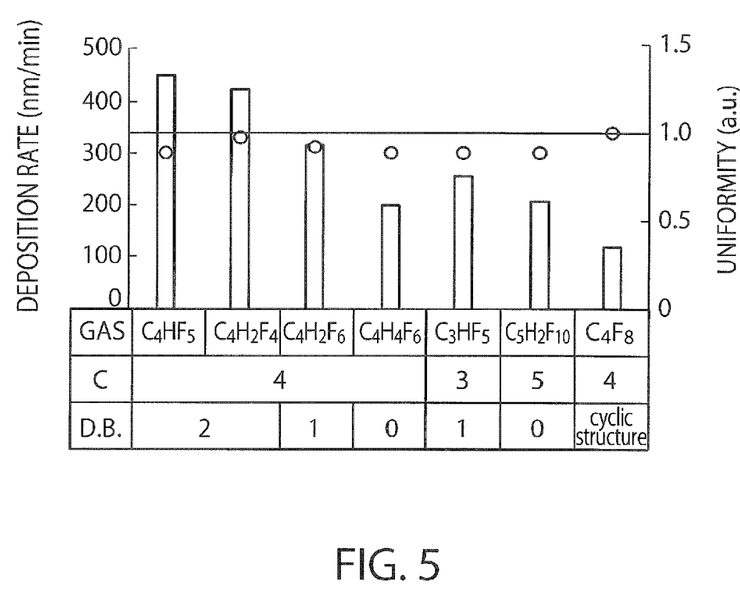
FIG. 5 is a graph for explaining characteristics of the etching gas of the first embodiment.

FIG. 5 is a graph for explaining characteristics of the etching gas of the first embodiment.

FIG. 5 shows deposition rates of the protecting film 7 as bars and uniformities (evennesses) of the protecting film 7 as points for the various kinds of CHF gas. The molecular structures of the CHF gas are as shown in FIGS. 4A to 4C.

From experiments of etching for the various kinds of $C_xH_yF_z$ gas, the results shown in FIG. 5 were obtained. The uniformities of the protecting film 7 were evaluated with the protecting film 7 in the case using the cyclic $C_4F_8$ gas, which was often used in processing insulators, being as a reference.

The uniformity was evaluated to be better as a change in film thickness of the protecting film 7 in the depth direction (Z-direction) was smaller, and specifically, the uniformity was evaluated to be better as the value of uniformity was lower.

Consequently, it was found that the uniformity of the protecting film 7 was better in the cases using $C_4HF_5$ gas, $C_4H_2F_4$ gas, $C_4H_2F_6$ gas, $C_4H_4F_6$ gas, $C_3HF_5$ gas and $C_5H_2F_{10}$ gas shown in FIG. 5 than in the case using the cyclic $C_4F_8$ gas. The etching gas of the present embodiment therefore desirably includes at least any of these kinds of gas as the $C_xH_yF_z$ gas. Moreover, the $C_4HF_5$ gas, the $C_4H_2F_4$ gas or the $C_4H_2F_6$ gas is desirably used when it is desirable to make the deposition rate of the protecting film 7 high while making the uniformity of the protecting film 7 good.

Referring to FIGS. 4A to 4C, it is clear that the terminal C atoms of the $C_4HF_5$ gas, the $C_4H_2F_4$ gas, the $C_4H_2F_6$ gas, the $C_4H_4F_6$ gas, the $C_3HF_5$ gas and the $C_5H_2F_{10}$ gas shown in FIG. 5 are bonded only to F atoms. The dry etching of the present embodiment is therefore desirably performed using the $C_xH_yF_z$ gas in which the terminal C atoms are bonded only to F atoms.

In FIGS. 4A to 4C, a molecular structure of $C_4HF_5$ is expressed as $CF_2$=CF—CH=$CF_2$, a molecular structure of $C_4H_2F_4$ is expressed as $CF_2$=CH—CH=$CF_2$, and a molecular structure of $C_4H_2F_6$ is expressed as $CF_3$—CH=CH—$CF_3$. Moreover, a molecular structure of $C_4H_4F_6$ is expressed as $CF_3$—$CH_2$—$CH_2$—$CF_3$, a molecular structure of $C_3HF_5$ is expressed as $CF_2$=CH—$CF_3$, and a molecular structure of $C_5H_2F_{10}$ is expressed as $CF_3$—CHF—CHF—$CF_2$—$CF_3$.

Examples of the $C_xH_yF_z$ gas of the present embodiment are not limited to these. Other examples of the $C_xH_yF_z$ gas of the present embodiment include $C_4H_4F_6$ ($CF_3$—$CH_2$—$CH_2$—$CF_3$) gas, $C_4H_3F_7$ ($CF_3$—CHF—$CH_2$—$CF_3$) gas, $C_4H_2F_8$ ($CF_3$—CHF—CHF—$CF_3$ or $CF_3$—$CF_2$—$CH_2$—$CF_3$) gas, $C_4HF_9$ ($CF_3$—CHF—$CF_2$—$CF_3$) gas and $C_5H_6F_6$ ($CF_3$—$CH_2$—$CH_2$—$CH_2$—$CF_3$) gas. Still other examples of the $C_xH_yF_z$ gas of the present embodiment include some kinds of isomers of $C_5H_5F_7$ gas, $C_5H_4F_8$ gas, $C_5H_3F_9$ gas, $C_5H_2F_{10}$ gas, $C_5HF_{11}$ gas and the like, the terminal C atoms in these isomers being bonded only to F atoms.

The etching gas of the present embodiment may be mixture gas including the $C_xH_yF_z$ gas and other gas or may be mixture gas including two or more kinds of $C_xH_yF_z$ gas. For example, the etching gas of the present embodiment may include oxygen gas, rare gas or $C_aF_b$ (fluorocarbon (fluorocarbon compound)) gas along with the $C_xH_yF_z$ gas. Note that "a" and "b" denote integers of one or more. Examples of the $C_aF_b$ gas include $CF_4$ gas, $C_2F_4$ gas, $C_3F_6$ gas, $C_4F_6$ gas and $C_4F_8$ gas.

Herein, plasma generated from the $C_xH_yF_z$ gas is described.

The insulating layers 4 and the sacrificial layers 3 of the present embodiment are etched using plasma generated from the $C_xH_yF_z$ gas in the step of FIG. 1B. Specifically, the protecting film 7 is formed with radicals included in the plasma, and the side faces of the insulating layers 4 and the sacrificial layers 3 are etched with ions included in the plasma. An average density (concentration) of the plasma in the etching treatment process chamber in this stage is, for example, $5.0 \times 10^9$ to $3.0 \times 10^{11}$ quantity/cm$^3$.

The plasma of the present embodiment can include first to third radicals below. The first radical is generated by eliminating only H atom(s) out of H and F atoms from a $C_xH_yF_z$ molecule. The second radical is generated by eliminating only F atom(s) out of H and F atoms from a $C_xH_yF_z$ molecule. The third radical is generated by eliminating both of H and F atoms from a $C_xH_yF_z$ molecule. The radical denoted by sign P2 in FIG. 3 is an example of the first radical.

In the present embodiment, the $C_xH_yF_z$ gas is desirably made into the plasma such that many first radicals are generated and not so many second and third radicals are generated. Specifically, the $C_xH_yF_z$ gas is desirably made into the plasma such that a concentration of first radicals in the plasma is larger than a total concentration of second and third radicals in the plasma. The reason is that the steric hindrances around unpaired electrons of the second and third radicals are smaller than the steric hindrance around an unpaired electron of the first radical in many cases, which makes sticking possibilities of the second and third radicals higher than a sticking possibility of the first radical.

Figure 6:
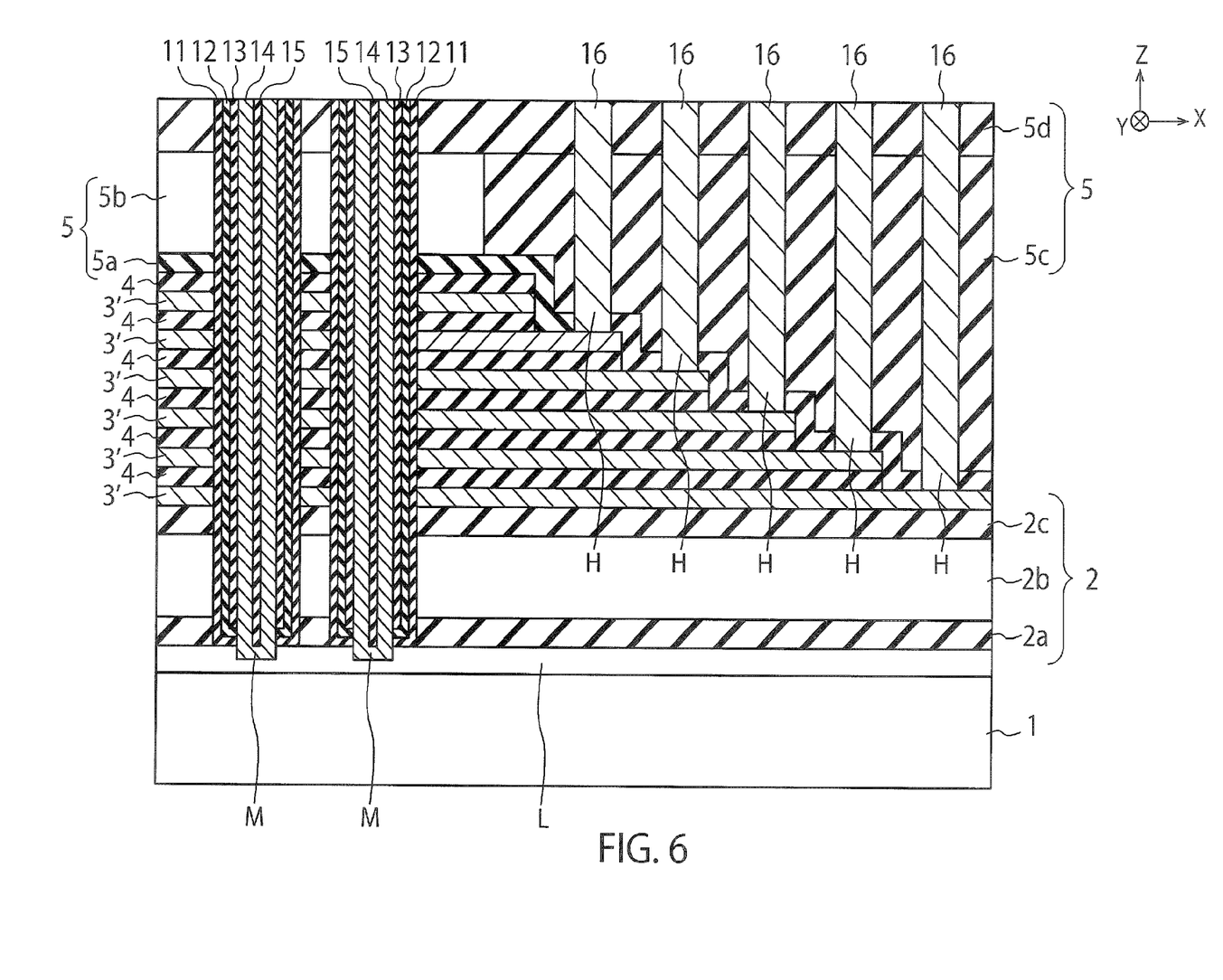
FIG. 6 is a sectional view showing a structure of the semiconductor device of the first embodiment.

FIG. 6 is a sectional view showing a structure of a semiconductor device of the first embodiment.

FIG. 6 shows an example of the semiconductor device manufactured by the method of the present embodiment. FIG. 6 shows a memory cell part and a step-like contact part of a three-dimensional memory. In FIG. 6, the lower layer 2 is constituted of a first insulator 2a, a source-side conducting layer 2b and a second insulator 2c, and the upper layer 5 is constituted of a cover insulator 5a, a drain-side conducting layer 5b, a first inter layer dielectric 5c and a second inter layer dielectric 5d. The channel semiconductor layers 14 are electrically connected to a diffusion layer L in the substrate 1. The sacrificial layers 3 are replaced by electrode layers 3' including tungsten (W) layers or the like. The electrode layers 3' are examples of the first films.

FIG. 6 further shows contact plugs 16 formed in contact holes H of the upper layer 5. The contact plugs 16 are formed so as to be electrically connected to the corresponding electrode layers 3'.

As above, the memory holes M of the present embodiment are formed using the etching gas including the $C_xH_yF_z$ gas, and each of terminal C atoms on a carbon chain of the $C_xH_yF_z$ gas is bonded only to F atoms out of H atoms and F atoms. The present embodiment therefore makes it possible to form the protecting films 7 down to deep places in the memory holes M and to preferably protect the side faces of the insulating layers 4 and the sacrificial layers 3 in the memory holes M with the protecting films 7. The present embodiment therefore makes it possible to preferably etch the insulating layers 4 and the sacrificial layers 3 to form the memory holes M. The present embodiment makes it possible to form even the memory holes M having a high aspect ratio, for example, of 10 or more into preferable shapes.

In the step of FIG. 1A, the plurality of electrode layers 3' and the plurality of insulating layers 4 may be alternately formed on the lower layer 2 instead of alternately forming the plurality of sacrificial layers 3 and the plurality of insulating layers 4 on the lower layer 2. In this case, the step is unnecessary in which the sacrificial layers 3 are replaced by the electrode layers 3'.

Moreover, the dry etching of the present embodiment can be applied to a step other than the processing of the memory holes M, for example, can be applied to a step of processing concave portions other than the memory holes M.

While certain embodiments have been described, these embodiments have been presented by way of example only, and are not intended to limit the scope of the inventions. Indeed, the novel methods and gases described herein may be embodied in a variety of other forms; furthermore, various omissions, substitutions and changes in the form of the methods and gases described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
   forming an organic hard mask layer including a pattern, on a film;
   forming a concave portion in the film by etching the film with the organic hard mask layer and etching gas that includes a chain hydrocarbon compound expressed as $C_xH_yF_z$ where C, H and F respectively denote carbon, hydrogen and fluorine, "x" denotes an integer of three or more, "y" denotes an integer of one or more, and "z" denotes an integer of two or more; and
   forming a charge storage layer and a semiconductor layer in the concave portion,
   wherein the $C_xH_yF_z$ is the chain hydrocarbon compound in which each of terminal carbon atoms on a carbon chain of the chain hydrocarbon compound is bonded only to fluorine atoms out of hydrogen and fluorine atoms,
   the film is etched with plasma generated from the etching gas including the chain hydrocarbon compound expressed as the $C_xH_yF_z$,
   the plasma includes a first radical generated by eliminating only hydrogen atom(s) out of hydrogen and fluorine atoms from a molecule of the chain hydrocarbon compound expressed as the $C_xH_yF_z$, a second radical generated by eliminating only fluorine atom(s) out of hydrogen and fluorine atoms from a molecule of the chain hydrocarbon compound expressed as the $C_xH_yF_z$, and a third radical generated by eliminating both hydrogen and fluorine atoms from a molecule of the chain hydrocarbon compound expressed as the $C_xH_yF_z$, and
   a concentration of the first radicals in the plasma is larger than a total concentration of the second and third radicals in the plasma.

2. The method of claim 1, wherein the etching gas includes the chain hydrocarbon compound expressed as the $C_xH_yF_z$ where a value of "x" is an integer from 3 to 5 and y≤z.

3. The method of claim 1, wherein the $C_xH_yF_z$ includes at least any of $C_3HF_5$, $C_4H_4F_6$, $C_4H_3F_7$, $C_4H_2F_8$, $C_4HF_9$, $C_5H_6F_6$, $C_5H_5F_7$, $C_5H_4F_8$, $C_5H_3F_9$, $C_5H_2F_{10}$ and $C_5HF_{11}$.

4. The method of claim 1, wherein the etching gas further includes at least any of oxygen gas, rare gas, and fluorocarbon compound gas expressed as $C_aF_b$ where "a" denotes an integer of one or more, and "b" denotes an integer of two or more.

5. The method of claim 4, wherein the $C_aF_b$ includes at least any of $CF_4$, $C_2F_4$, $C_3F_6$, $C_4F_6$ and $C_4F_8$.

6. The method of claim 1, wherein the etching gas includes two or more kinds of chain hydrocarbon compounds expressed as the $C_xH_yF_z$.

7. The method of claim 1, wherein the etching gas includes a linear chain-type chain hydrocarbon compound expressed as the $C_xH_yF_z$.

8. The method of claim 1, wherein a density of the plasma in a chamber is $5.0 \times 10^9$ to $3.0 \times 10^{11}$ quantity/cm$^3$.

9. The method of claim 1, wherein the film includes a plurality of first films and a plurality of second films alternately formed on a substrate.

10. The method of claim 1, wherein a concave portion with 10 or more of aspect ratio is formed in the film during the etching.

11. The method of claim 1, wherein during the etching, another film including a fluorocarbon compound expressed as $C_mF_n$ is formed on side faces of the organic hard mask layer and the concave portion where "m" denotes an integer of one or more, and "n" denotes an integer of two or more, and
   the charge storage layer and the semiconductor layer are formed in the concave portion after removing the another film including the fluorocarbon compound formed on the side faces.

12. A method of manufacturing a semiconductor device, comprising:
   forming a concave portion in a film by etching the film with etching gas that includes a chain hydrocarbon compound expressed as $C_xH_yF_z$ where C, H and F respectively denote carbon, hydrogen and fluorine, "x" denotes an integer of three or more, "y" denotes an integer of one or more, and "z" denotes an integer of two or more,
   wherein
   the $C_xH_yF_z$ is the chain hydrocarbon compound in which each of terminal carbon atoms on a carbon chain of the chain hydrocarbon compound is bonded only to fluorine atoms out of hydrogen and fluorine atoms,
   the film is etched with plasma generated from the etching gas including the chain hydrocarbon compound expressed as the $C_xH_yF_z$,
   the plasma includes a first radical generated by eliminating only hydrogen atom(s) out of hydrogen and fluorine atoms from a molecule of the chain hydrocarbon compound expressed as the $C_xH_yF_z$, a second radical generated by eliminating only fluorine atom(s) out of hydrogen and fluorine atoms from a molecule of the chain hydrocarbon compound expressed as the $C_xH_yF_z$, and a third radical generated by eliminating both hydrogen and fluorine atoms from a molecule of the chain hydrocarbon compound expressed as the $C_xH_yF_z$, and
   a concentration of the first radicals in the plasma is larger than a total concentration of the second and third radicals in the plasma.

* * * * *